(12) United States Patent
Nishimura et al.

(10) Patent No.: US 9,866,199 B2
(45) Date of Patent: Jan. 9, 2018

(54) VIBRATING DEVICE

(71) Applicant: Murata Manufacturing Co., Ltd., Nagaokakyo-shi, Kyoto-fu (JP)

(72) Inventors: Toshio Nishimura, Nagaokakyo (JP); Takashi Hase, Nagaokakyo (JP); Keisuke Takeyama, Nagaokakyo (JP); Hiroaki Kaida, Nagaokakyo (JP); Keiichi Umeda, Nagaokakyo (JP); Takehiko Kishi, Nagaokakyo (JP); Hiroshi Yamada, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 174 days.

(21) Appl. No.: 14/937,026

(22) Filed: Nov. 10, 2015

(65) Prior Publication Data

US 2016/0065173 A1 Mar. 3, 2016

Related U.S. Application Data

(63) Continuation of application No. PCT/JP2014/062079, filed on May 1, 2014.

(30) Foreign Application Priority Data

May 13, 2013 (JP) ................................. 2013-101300

(51) Int. Cl.
*H03H 9/21* (2006.01)
*H01L 41/047* (2006.01)

(52) U.S. Cl.
CPC ............ *H03H 9/21* (2013.01); *H01L 41/0478* (2013.01)

(58) Field of Classification Search
CPC .... H03H 9/21; H03H 9/215; H03H 2003/026; H03H 2003/0492; H03H 9/2468;
(Continued)

(56) References Cited

U.S. PATENT DOCUMENTS 5,824,900 A 10/1998 Konno et al.
8,098,002 B2 * 1/2012 Baborowski ............. H03H 3/04
310/370

(Continued)

FOREIGN PATENT DOCUMENTS

JP 3360478 B2 12/2002
JP 2004-274589 A 9/2004
(Continued)

OTHER PUBLICATIONS

International Search Report issued for PCT/JP2014/062080, dated Aug. 5, 2014.
(Continued)

*Primary Examiner* — J. San Martin
(74) *Attorney, Agent, or Firm* — Arent Fox LLP

(57) ABSTRACT

A vibrating device having tuning fork arms extending in a first direction that are joined to a base portion and are arranged side by side in an second direction. Each of the tuning fork arms has a structure that a silicon oxide layer is laminated on a Si layer made of a degenerate semiconductor, and that an excitation portion is provided on the silicon oxide layer. When a total thickness of the Si layer is denoted by T1, a total thickness of the silicon oxide layer is denoted by T2, and the temperature coefficient of resonant frequency (TCF) when the silicon oxide layer is not provided on the Si layer is denoted by x, a thickness ratio T2/(T1+T2) is within a range of $(-0.0002x^2-0.0136x+0.0014)\pm0.05$.

16 Claims, 6 Drawing Sheets

(58) Field of Classification Search
CPC .. H03H 9/2473; H03H 9/2484; H03H 9/2494; B06B 1/0659; G01C 19/5607
USPC ......................................................... 310/370
See application file for complete search history.

(56) References Cited

U.S. PATENT DOCUMENTS

| | | |
|---|---|---|
| 8,310,317 B2 | 11/2012 | Yamada |
| 8,610,338 B2 | 12/2013 | Ichikawa et al. |
| 8,810,327 B2 | 6/2014 | Yamada |
| 2009/0058226 A1 | 3/2009 | Furuhata et al. |
| 2009/0178260 A1 | 7/2009 | Yamazaki et al. |
| 2010/0013360 A1 | 1/2010 | Baborowski et al. |
| 2010/0156237 A1 | 6/2010 | Ichikawa et al. |
| 2010/0201223 A1 | 8/2010 | Ishii et al. |
| 2010/0244989 A1 | 9/2010 | Furuhata et al. |
| 2011/0014069 A1 | 1/2011 | Wada et al. |
| 2011/0187470 A1 | 8/2011 | Yamada |
| 2012/0126664 A1 | 5/2012 | Ogura et al. |
| 2012/0194283 A1 | 8/2012 | Funakawa et al. |
| 2013/0038171 A1 | 2/2013 | Yamada |
| 2013/0119823 A1 | 5/2013 | Ichikawa et al. |
| 2013/0283910 A1 | 10/2013 | Nishizawa et al. |
| 2013/0312519 A1 | 11/2013 | Ichikawa |
| 2014/0290362 A1 | 10/2014 | Nakagawa et al. |
| 2015/0116050 A1 | 4/2015 | Nakagawa et al. |
| 2016/0065173 A1 | 3/2016 | Nishimura |

FOREIGN PATENT DOCUMENTS

| | | |
|---|---|---|
| JP | 2009-005022 A | 1/2009 |
| JP | 2009-081836 A | 4/2009 |
| JP | 2010-028535 A | 2/2010 |
| JP | 2010-028536 A | 2/2010 |
| JP | 2010-050960 A | 3/2010 |
| JP | 2010-147964 A | 7/2010 |
| JP | 2011-087154 A | 4/2011 |
| JP | 2011-160250 A | 8/2011 |
| JP | 2011-223489 A | 11/2011 |
| JP | 2012-015886 A | 1/2012 |
| JP | 2012-034171 A | 2/2012 |
| JP | 2012-065293 A | 3/2012 |
| JP | 2012044235 A | 3/2012 |
| JP | 2012-105044 A | 5/2012 |
| JP | 2013-082643 A | 4/2013 |
| WO | WO 2008/043727 A1 | 4/2008 |
| WO | WO 2009/119431 A | 10/2009 |
| WO | WO 2010/062847 A2 | 6/2010 |
| WO | WO 2012/110708 A1 | 8/2012 |
| WO | WO 2012/156585 A1 | 11/2012 |

OTHER PUBLICATIONS

Written Opinion of the International Searching Authority issued for PCT/JP2014/062080, dated Aug. 5, 2014.
International Search Report issued for PCT/JP2014/062079, dated Aug. 5, 2014.
Written Opinion of the International Searching Authority issued for PCT/JP2014/062079, dated Aug. 5, 2014.

* cited by examiner

VIBRATING DEVICE

CROSS REFERENCE TO RELATED APPLICATIONS

The present application is a continuation of International application No. PCT/JP2014/062079, filed May 1, 2014, which claims priority to Japanese Patent Application No. 2013-101300, filed May 13, 2013, the entire contents of each of which are incorporated herein by reference.

FIELD OF THE INVENTION

The present invention relates to a vibrating device including a plurality of tuning fork arms, and more particularly to an MEMS vibrating device.

BACKGROUND OF THE INVENTION

An MEMS (Micro Electro Mechanical Systems) structure is so far known in which an excitation portion including a piezoelectric thin film is constituted on a Si semiconductor layer. Various trials have been made to improve the temperature coefficient of resonant frequency (TCF) in a vibrator with the MEMS structure. Patent Document 1, given below, discloses a method of reducing an absolute value of the TCF by laminating Si and $SiO_2$. Patent Documents 2 and 3, given below, disclose a method of reducing the primary temperature coefficient of resonant frequency of Si itself by doping a p-type or n-type dopant into Si.

Patent Document 4, given below, discloses a method of using a $Si/SiO_2$ combined material and doping Si at a high concentration. Patent Document 4 states that the secondary temperature coefficient of resonant frequency can be reduced.

Patent Document 1: International Publication No. WO2008/043727
Patent Document 2: International Publication No. WO2010/062847
Patent Document 3: International Publication No. WO2012/110708
Patent Document 4: International Publication No. WO2012/156585

SUMMARY OF THE INVENTION

Various methods for reducing the absolute value of the TCF in the vibrator with the MEMS structure have been proposed as disclosed in Patent Documents 1 to 4. However, those disclosed methods have a difficulty in sufficiently reducing the absolute value of the TCF.

An object of the present invention is to provide a vibrating device capable of further reducing an absolute value of the temperature coefficient of resonant frequency (TCF).

A first invention of this application provides a vibrating device including a base portion, and a plurality of tuning fork arms each being joined at one end to the base portion and extending in a Y-direction. The plural tuning fork arms are arranged side by side in an X-direction that is perpendicular to the Y-direction.

In the first invention, assuming that a direction perpendicular to the X-direction and the Y-direction is a Z-direction, the tuning fork arm causes flexural vibration in the Z-direction.

The tuning fork arm includes a Si layer made of a degenerate semiconductor, a silicon oxide layer, a piezoelectric layer, and first and second electrodes through which a voltage is applied to the piezoelectric layer. Given that a total thickness of the Si layer is denoted by T1, a total thickness of the silicon oxide layer is denoted by T2, and TCF in the vibrating device when the silicon oxide layer is not provided is denoted by x (ppm/K), $T2/(T1+T2)$ is within a range of $(-0.0002x^2-0.0136x+0.0014)\pm0.05$.

According to one specific aspect of the first invention, directions of vibrations of the plural tuning fork arms are symmetric between one side of a centerline passing a center in the X-direction and extending in the Y-direction and the other side of the centerline.

A vibrating device according to a second invention includes a base portion, and a plurality of tuning fork arms each being joined at one end to the base portion and extending in a Y-direction. The plural tuning fork arms are arranged side by side in an X-direction that is perpendicular to the Y-direction. In the second invention, the tuning fork arm causes flexural vibration in the X-direction.

In the second invention, the tuning fork arm includes a Si layer made of a degenerate semiconductor, a silicon oxide layer, a piezoelectric layer, and first and second electrodes through which a voltage is applied to the piezoelectric layer. In the second invention, given that a total thickness of the Si layer is denoted by T1, a total thickness of the silicon oxide layer is denoted by T2, and TCF in the vibrating device when the silicon oxide layer is not provided is denoted by x (ppm/K), $T2/(T1+T2)$ is within a range of $(-0.0003x^2-0.0236x+0.0219)\pm0.05$.

According to one specific aspect of the second invention, directions of vibrations of the plural tuning fork arms are symmetric between one side of a centerline passing a center in the X-direction and extending in the Y-direction and the other side of the centerline.

According to another specific aspect of the present invention (the first and second inventions are collectively referred to as the present invention hereinafter), the Si layer is doped with an n-type dopant. Preferably, phosphorus (P) is used as the dopant.

According to still another specific aspect of the vibrating device of the present invention, the silicon oxide layer is laminated on one principal surface of the Si layer.

According to still another specific aspect of the vibrating device of the present invention, the first electrode is disposed on one principal surface of the piezoelectric layer, and the second electrode is disposed on the other principal surface of the piezoelectric layer.

According to still another specific aspect of the vibrating device of the present invention, the Si layer serves also as the second electrode.

According to still another specific aspect of the vibrating device of the present invention, the silicon oxide layer is formed on each of both surfaces of the Si layer.

According to the vibrating device of the present invention, since the total thickness T2 of the silicon oxide layer is set to fall within the above-mentioned specific range, an absolute value of the temperature coefficient of resonant frequency (TCF) can be further reduced. Hence the vibrating device having satisfactory temperature characteristics can be provided.

DETAILED DESCRIPTION OF THE PREFERRED EMBODIMENTS

Practical embodiments of the present invention will be described below with reference to the drawings for clear understanding of the present invention.

Figure 1A:
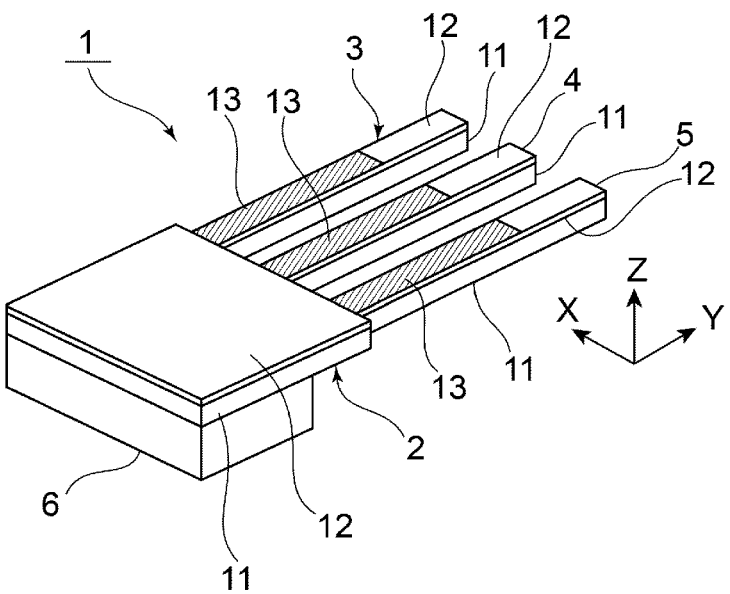
FIG. 1(a) is a perspective view of a vibrating device according to a first embodiment of the present invention.
Figure 1B:
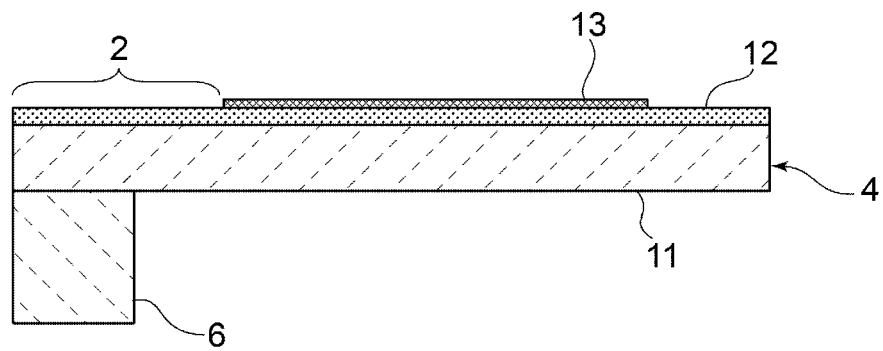
FIG. 1(b) is a front sectional view of the vibrating device.
Figure 1C:
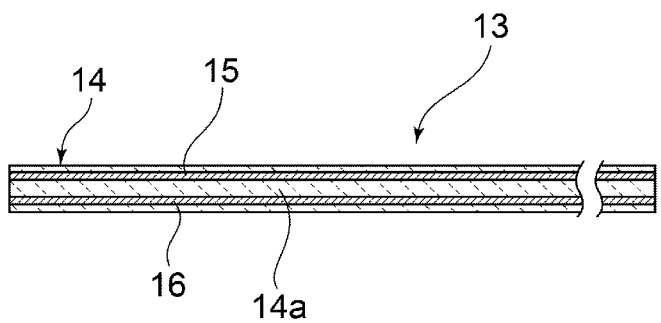
FIG. 1(c) is a front sectional view, partly cut-away, illustrating a sectional structure of an excitation portion used in the first embodiment.
Figure 2:
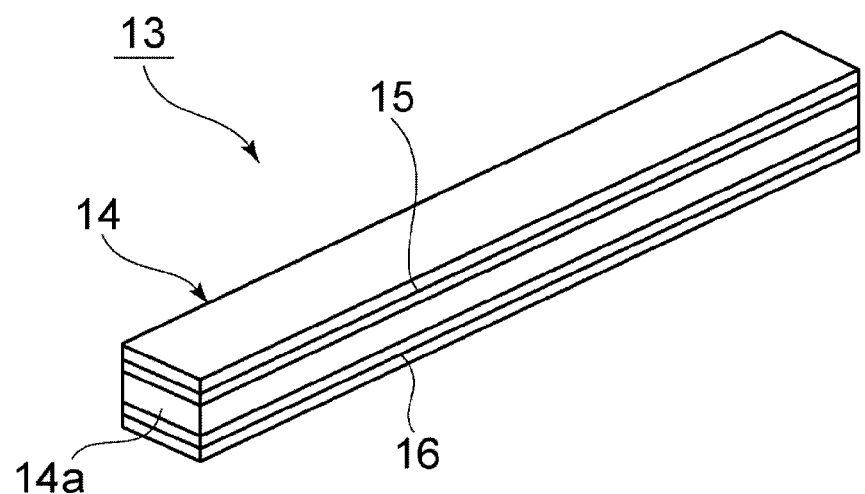
FIG. 2 is a perspective view of the excitation portion used in the first embodiment.

FIG. 1(a) is a perspective view of a vibrating device according to a first embodiment of the present invention, FIG. 1(b) is a front sectional view of the vibrating device, and FIG. 1(c) is a front sectional view, partly cut-away, illustrating a sectional structure of an excitation portion used in the first embodiment.

The vibrating device 1 includes a base portion 2. A plurality of tuning fork arms 3 to 5 is disposed integrally with the base portion 2. The base portion 2 is in the form of a rectangular plate. Respective one ends of the plural tuning fork arms 3 to 5 each extending in a lengthwise direction are joined to one lateral surface of the base portion 2.

A support portion 6 is fixed to a lower surface of the base portion 2. The support portion 6 serves as a portion used for fixing the vibrating device 1 to the outside.

As illustrated in FIG. 1(a), the direction in which the tuning fork arms 3 to 5 extend is defined as a Y-direction. A direction perpendicular to the Y-direction in a plane, which is parallel to both principal surfaces of the base portion 2, is defined as an X-direction. The lateral surface of the base portion 2 to which the respective one ends of the tuning fork arms 3 to 5 are joined extends in the X-direction. Thus, the plural tuning fork arms 3 to 5 are arranged side by side in the X-direction.

A Z-direction is a direction perpendicular to a plane that is specified by the X-direction and the Y-direction.

In this embodiment, the three tuning fork arms 3 to 5 cause flexural vibrations in the Z-direction as described later.

As illustrated in FIG. 1(b), the support portion 6 is formed integrally with a Si layer 11 of the base portion 2. The support portion 6 may be made of a semiconductor material or an insulating material, such as Si or $Al_2O_3$. The base portion 2 may be bonded to the support portion 6 by employing an adhesive.

The base portion 2 has a structure in which a silicon oxide layer 12 is laminated on the Si layer 11. The tuning fork arm 4 also has a structure in which a silicon oxide layer 12 is laminated on a Si layer 11. In other words, the Si layer 11 and the silicon oxide layer 12 in the tuning fork arm 4 are formed integrally with the base portion 2.

The Si layer 11 is made of a degenerate semiconductor. In this embodiment, the Si layer is made of an n-type Si semiconductor. Because the Si layer is a degenerate semiconductor, the doping concentration of an n-type dopant therein is $1 \times 10^{19}/cm^3$ or more. An example of the n-type dopant is a group 15 element, such as P, As or Sb. Preferably, P is used as the dopant. In that case, an n-type degenerate semiconductor can be manufactured easily.

The silicon oxide layer 12 is made of $SiO_2$ in this embodiment. Thus, in this embodiment, the silicon oxide layer 12 made of $SiO_2$ is laminated on an upper surface of the Si layer 11.

In the base portion 2, the silicon oxide layer 12 may be dispensed with. It is, however, desired that the silicon oxide layer 12 is provided as in this embodiment. With the provision of the silicon oxide layer, a manufacturing process can be simplified.

The silicon oxide layer 12 can be made of, without being limited to $SiO_2$, a silicon oxide-based material having a proper composition expressed by $Si_aO_b$ (a, b: integer).

In this embodiment, an excitation portion 13 includes a piezoelectric thin film 14, a first electrode 15, and a second electrode 16. The first electrode 15 and the second electrode 16 are disposed in a state sandwiching a part of the piezoelectric thin film 14, i.e., a piezoelectric thin film layer 14a, between them. The first and second electrodes 15 and 16 are not always required to be buried in the piezoelectric thin film 14. In another example, the first and second electrodes 15 and 16 may be formed on an upper surface and a lower surface of the piezoelectric thin film 14, respectively.

Moisture resistance, etc. can be increased by arranging the first and second electrodes 15 and 16 within the piezoelectric thin film 14 as in this embodiment.

A piezoelectric material constituting the piezoelectric thin film 14 is not limited to particular one. In a vibrating device utilizing a bulk wave, however, a Q-value is preferably as high as possible. For that reason, AlN having a small electromechanical coupling coefficient $k^2$, but having a high Q-value is suitably used.

ZnO, Sc-substituted AlN, PZT, KNN, etc. may be used instead of AlN. In the case using a Sc-substituted AlN film (ScAlN), a Sc concentration is desirably about 0.5 at % to 50 at % on condition that an atomic concentration of Sc and Al is 100 at %.

ScAlN has a larger electromechanical coupling coefficient $k^2$ than AlN, and has larger mechanical Qm than PZT and KNN. Accordingly, when ScAlN is applied to a resonant vibrator as in the present invention, the following advantages can be obtained. An exemplary application of the resonant vibrator is an oscillator. In a TCXO (temperature compensated (crystal) oscillator), for example, a signal from a built-in temperature sensor is fed back to a variable capacitance element, which is connected in series to the vibrator, thereby changing a capacitance value of the variable capacitance element. As a result, an oscillation frequency can be adjusted. On that occasion, when ScAlN is used as the piezoelectric thin film instead of AlN, a specific band of the resonant vibrator is widened. Hence an adjustment range of the oscillation frequency can be widened.

Similarly, when ScAlN is used in a VCXO (voltage controlled oscillator), an adjustment range of the oscillation frequency is widened. Accordingly, initial frequency variations of the resonant vibrator can be adjusted by the variable capacitance element. Hence the cost of a frequency adjusting step can be reduced greatly.

The first and second electrodes 15 and 16 can be each formed by employing a proper metal, such as Mo, Ru, Pt, Ti, Cr, Al, Cu, Ag, or an alloy of those elements.

The piezoelectric thin film 14 is polarized in the thickness direction. By applying an alternating electric field between the first and second electrodes 15 and 16, therefore, the excitation portion 13 is excited due to the piezoelectric effect. As a result, the tuning fork arm 4 causes flexural vibration in the Z-direction.

In this embodiment, the tuning fork arms 3 and 5 and the tuning fork arm 4 cause flexural vibrations in the Z-direction in opposite phases. Such a state can be achieved by making the phase of an alternating electric field, which is applied to the tuning fork arm 4, opposite to the phase of an alternating electric field that is applied to each of the tuning fork arms 3 and 5. As an alternative, the direction of polarization of the piezoelectric thin film 14 in the tuning fork arm 4 may be set opposite to that of the piezoelectric thin film 14 in each of the tuning fork arms 3 and 5. In such a case, the tuning fork arms 3 to 5 may be driven by applying alternating electric fields in the same phase.

Thus, the directions of vibrations are symmetric between one side of a centerline passing the center in the X-direction and extending in the Y-direction and the other side of the centerline.

In this embodiment, the three tuning fork arms 3 to 5 cause flexural vibrations in the Z-direction as described above. The vibrating device 1 is fixed to the outside through the support portion 6 in a way not impeding those flexural vibrations. The support portion 6 can be made of an appropriate rigid material, such as Si or $Al_2O_3$. In other words, the support portion 6 can be made of an appropriate semiconductor material or an insulating material. Preferably, the support portion 6 is formed integrally by employing the same material as that of the Si layer 11. By employing the same material, the manufacturing process can be simplified. As an alternative, the support portion 6 made of a different material may be bonded to the Si layer 11 with an adhesive interposed therebetween.

This embodiment is featured in that an absolute value of the temperature coefficient of resonant frequency (TCF) can be held very small by setting, in each of the tuning fork arms 3 to 5, a thickness T2 of the silicon oxide layer 12 made of $SiO_2$ to fall within a particular range. More specifically, it is here assumed that the thickness of the silicon oxide layer 12 is denoted by T2, and the thickness of the Si layer 11 is denoted by T1. Assuming further that the TCF in the vibrating device 1 when the silicon oxide layer 12 is not provided is denoted by x (ppm/K), T2/(T1+T2) is within a range of $(-0.0002x^2-0.0136x+0.0014)\pm0.05$.

The above point will be described below with reference to FIGS. 3 and 4.

Hitherto, various trials for reducing the temperature coefficient of resonant frequency (TCF) have been made by laminating a $SiO_2$ film on a Si layer. However, the TCF cannot be greatly reduced just by laminating, on Si, SiO having the TCF of which sign is opposite in phase to that of Si.

According to the present invention, the TCF can be greatly reduced by setting a thickness ratio of the silicon oxide layer 12, expressed by T2/(T1+T2), to fall within the above-mentioned particular range.

Figure 3:
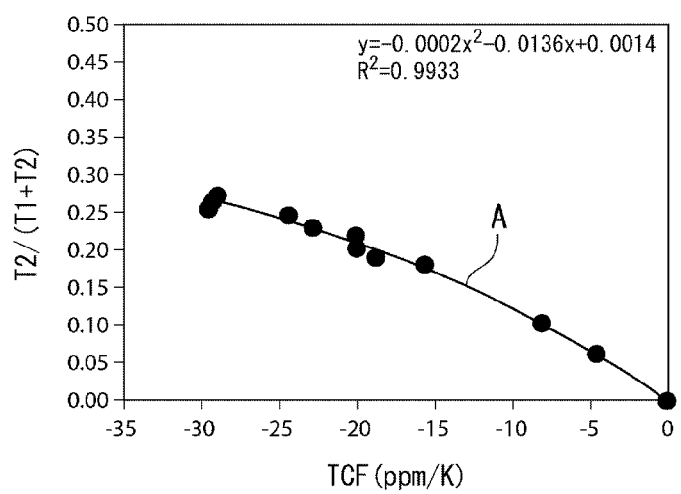
FIG. 3 is a graph depicting a relationship that the TCF becomes 0 with lamination of a silicon oxide layer on an assumption that the TCF of doped Si without the provision of the silicon oxide layer is denoted by x and a thickness ratio T2/(T1+T2) is denoted by y.

A curve A in FIG. 3 represents a relationship that the absolute value of the TCF becomes 0 in the vibrating device 1. In FIG. 3, the horizontal axis represents the TCF of the Si layer 11 when the silicon oxide layer 12 is not disposed on the Si layer 11. The TCF of the Si layer has a particular value depending on the doping concentration. The vertical axis represents the thickness ratio T2/(T1+T2).

At points plotted in FIG. 3, the TCF becomes 0 in each of structures where the silicon oxide layers are laminated in various film thicknesses on the doped Si layer 11.

Given here that the TCF of the Si is denoted by x and the thickness ratio T2/(T1+T2) is denoted by y, the curve A is obtained with approximation on the basis of the many plotted points. The curve A is expressed by $y=(-0.0002x^2-0.0136x+0.0014)$. Accordingly, the temperature coefficient of resonant frequency (TCF) in the vibrating device 1 can be made 0 by setting the thickness ratio T2/(T1+T2) to be positioned on the curve A. Furthermore, the inventor of this application has confirmed that, when T2/(T1+T2) is within a range of $(-0.0002x^2-0.0136x+0.0014)\pm0.05$ . . . Formula (1), the temperature coefficient of resonant frequency (TCF) can be kept within $0\pm5$ ppm/° C. In the vibrating device 1, therefore, the temperature coefficient of resonant frequency (TCF) can be kept within a range of ±5 ppm/° C. by setting the thickness ratio T2/(T1+T2) to fall within the above-mentioned range. As a result, the temperature coefficient of resonant frequency (TCF) can be greatly and reliably reduced.

Figure 4:
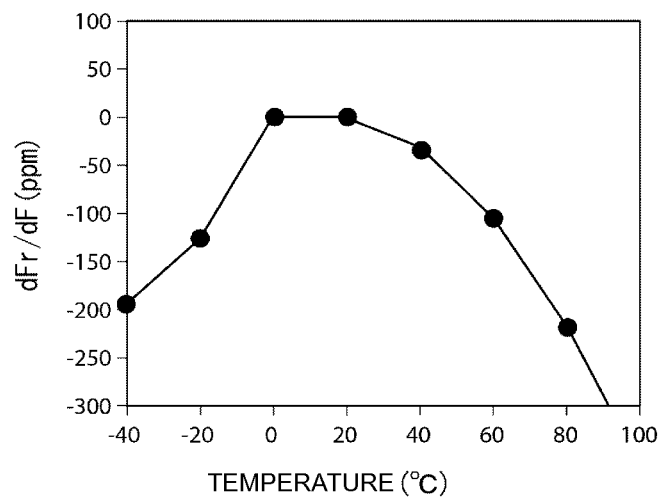
FIG. 4 is a graph depicting a relationship between a temperature and a resonant-frequency change rate (ppm) in the first embodiment.

FIG. 4 depicts temperature characteristics of the resonant frequency in the vibrating device 1 of the above-described embodiment. The horizontal axis represents a temperature, and the vertical axis represents a resonant-frequency change rate dFr/dF (ppm). The thicknesses T1 and T2 in each of the tuning fork arms 3 to 5 are set as follows.

T1=9.5 μm, and T2=0.5 μm. The length and the width of each of the tuning fork arms 3 to 5 are set to 650 μm long×20 μm wide.

In the excitation portion 13, the first and second electrodes 15 and 16 are each made of Mo having a thickness of 0.1 μm. The length over which the first and second electrodes 15 and 16 are opposed to each other is set to 325 μm. The thickness of the piezoelectric thin film layer 14a is set to 0.8 μm.

In the vibrating device 1 constituted as described above, assuming the resonant frequency at 20° C. to be a reference, a resonant-frequency change rate dFr from the resonant frequency at the reference depending on temperature, namely (Fr−resonant frequency at 20° C.)/(resonant frequency at 20° C.), was measured. Fr denotes the resonant frequency.

In the vibrating device 1 of this embodiment, as seen from FIG. 4, the resonant-frequency change rate is within 250 ppm over a range of about −40° C. to 85° C., and change of resonance characteristics depending on temperature is very small.

Figure 5:
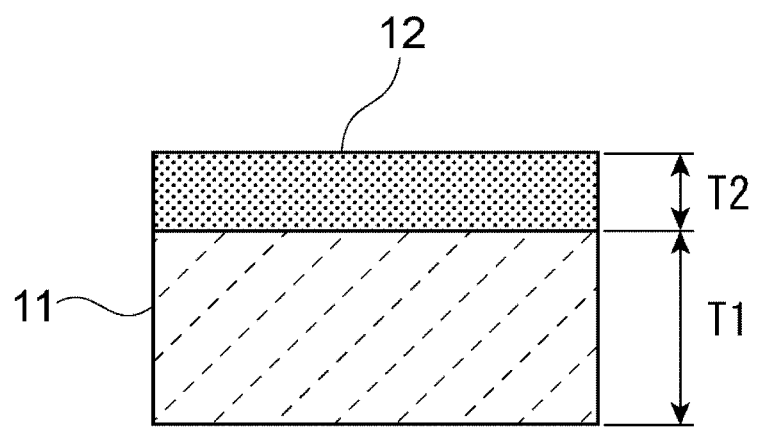
FIG. 5 is a schematic cross-sectional view illustrating a relationship in thickness between a Si layer and the silicon oxide layer, which constitute a multilayered structure in the first embodiment.

In the above-described embodiment, the silicon oxide layer 12 is laminated on the Si layer 11. In such a case, the thickness ratio T2/(T1+T2) is given as a ratio of T2 to a total of T1 and T2 as illustrated in FIG. 5.

Figure 6:
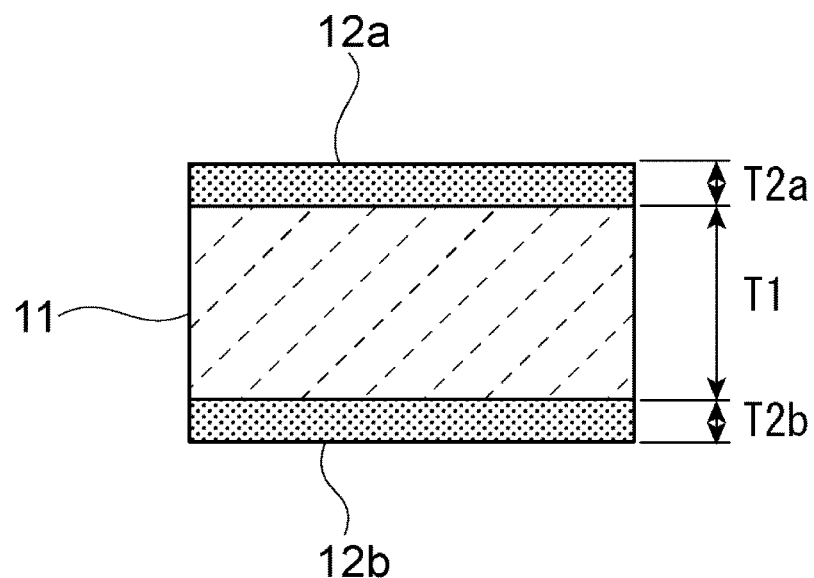
FIG. 6 is a cross-sectional view illustrating a multilayered structure of the Si layer and the silicon oxide layer in a modification of the first embodiment.

It is to be noted that, in the present invention, at least one of the Si layer 11 and the silicon oxide layer 12 may be formed by laminating a plurality of layers. In such a case, T1 and T2 are each given as a total thickness of the plural layers. For example, as illustrated in FIG. 6, a silicon oxide layer 12a may be laminated on the upper surface of the Si layer 11, and a silicon oxide layer 12b may be laminated on the lower surface of the Si layer 11. In such a case, T2 is given by T2=T2a+T2b. Stated in another way, a total thickness of the plural silicon oxide layers may be given as T2. Similarly, when a plurality of Si layers is laminated, a total thickness of the plural Si layers may be given as T1.

Figure 10A:
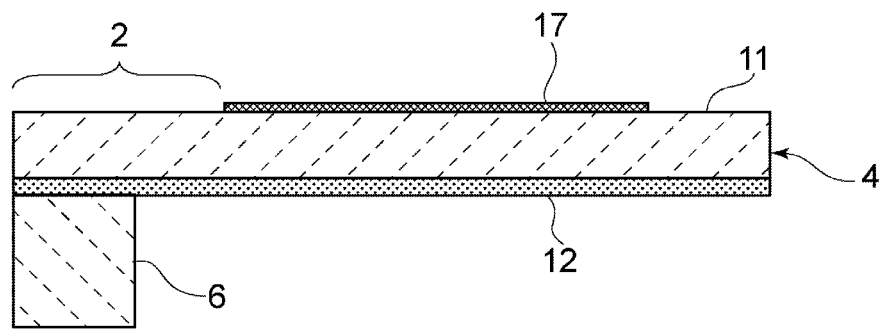
FIG. 10(a) is a front sectional view of a vibrating device according to a modification of the first embodiment of the present invention.
Figure 10B:
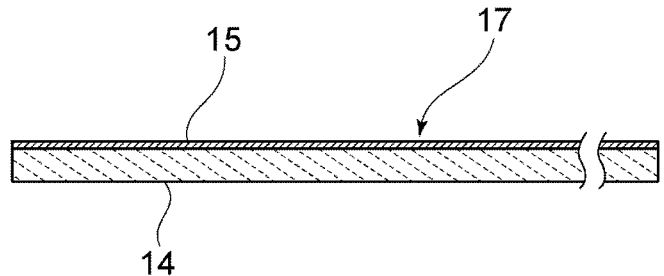
FIG. 10(b) is a front sectional view, partly cut-away, of an excitation portion used in the vibrating device according to the modification.

FIG. 10(a) is a front sectional view of a vibrating device according to a modification of the first embodiment of the present invention. FIG. 10(b) is a front sectional view, partly cut-away, of an excitation portion used in the vibrating device according to the modification.

In the vibrating device according to the modification of the first embodiment, as illustrated in FIG. 10(a), the silicon oxide layer 12 is laminated on one principal surface of the Si layer 11. An excitation portion 17 is laminated on the other principal surface of the Si layer 11. The excitation portion 17 includes the piezoelectric thin film 14 and the first electrode 15. In this modification, the second electrode 16 is not separately provided, and the Si layer 11 serves also as the second electrode. Additionally, the first electrode 15 is not buried in the piezoelectric thin film 14.

The piezoelectric thin film 14 and the first electrode 15 are laminated on the Si layer 11 in the mentioned order. Because of the Si layer 11 being made of a degenerative semiconductor, when the Si layer 11, the piezoelectric thin film 14, and the first electrode 15 are laminated in the mentioned order, the Si layer 11 acts as the second electrode. Thus, in this modification, a voltage is applied to the piezoelectric thin film 14 through the first electrode 15 and the Si layer 11. Since there is no necessity of separately providing the second electrode 16, the structure can be simplified in this modification. Hence the vibrating device having good reliability and high mass-productivity can be provided.

Figure 11:
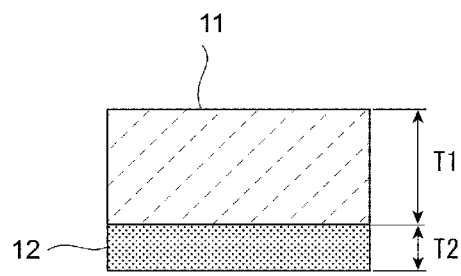
FIG. 11 is a front sectional view of a structure in which the silicon oxide layer is laminated on the Si layer in the modification of the first embodiment.

Also in this modification of the first embodiment, assuming that the thickness of the Si layer 11 is denoted by T1 and the thickness of the silicon oxide layer 12 is denoted by T2 as illustrated in FIG. 11, and that the TCF in the vibrating device 1 when the silicon oxide layer 12 is not provided is denoted by x (ppm/K), T2/(T1+T2) is within the range of $(-0.0002x^2-0.0136x+0.0014)\pm 0.05$. Under such a condition, the temperature coefficient of resonant frequency (TCF) can be greatly and reliably reduced and kept within the range of ±5 ppm/° C. Hence the vibrating device having satisfactory temperature characteristics can be provided.

Figure 7:
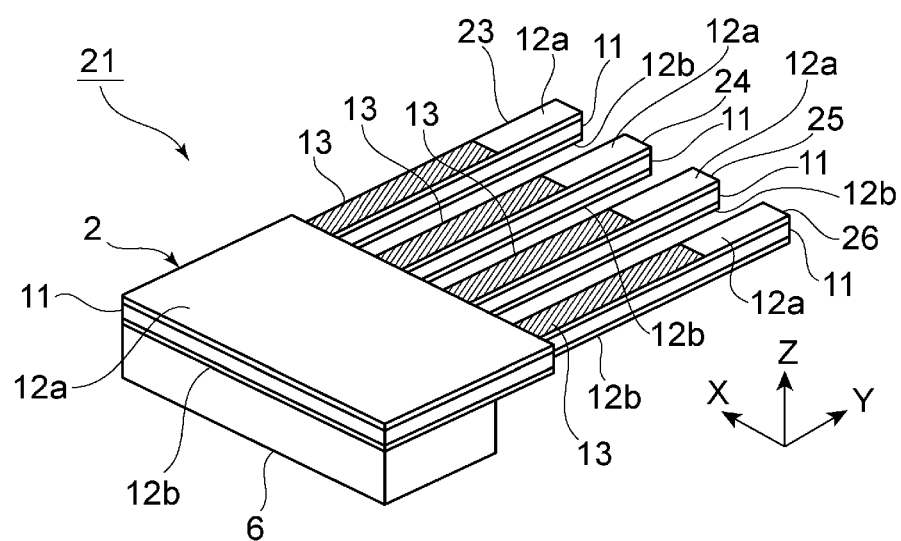
FIG. 7 is a perspective view of a vibrating device according to a second embodiment of the present invention.

FIG. 7 is a perspective view of a vibrating device according to a second embodiment of the present invention. The vibrating device 21 of the second embodiment is similar to the vibrating device of the first embodiment except that a silicon oxide layer 12a is laminated on the upper surface of the Si layer 11 and a silicon oxide layer 12b is laminated on the lower surface of the Si layer 11, and that four tuning fork arms 23 to 26 are joined to the base portion 2. Accordingly, the same parts are denoted by the same reference signs, and description of those parts is omitted.

As mentioned above, the silicon oxide layer 12a may be laminated on the upper surface of the Si layer 11, and the silicon oxide layer 12b may be laminated on the lower surface of the Si layer 11.

Furthermore, the four tuning fork arms 23 to 26 may be joined to the base portion 2 as in this embodiment. Also in this embodiment, the tuning fork arms 23 to 26 extend in the Y-direction. The tuning fork arms 23 to 26 are arranged side by side in the X-direction. The tuning fork arms 23 to 26 cause flexural vibrations in the Z-direction. Here, the tuning fork arms 24 and 25 in a central side region and the tuning fork arms 23 and 26 in outer side regions are driven to vibrate in opposite phases. In other words, the opposite sides of a centerline passing the center in the X-direction and extending in the Y-direction are displaced in a symmetric relation. Thus, the tuning fork arm 24 positioned at one side of the centerline and the tuning fork arm 25 positioned at the other side are vibrated in the same phase. The tuning fork arm 23 and the tuning fork arm 26 are vibrated in the same phase.

The above-mentioned flexural vibrations can be achieved by making the phase of the alternating electric field, which is applied to drive the respective excitation portions 13 and 13 of the tuning fork arms 24 and 25, opposite to the phase of the alternating electric field that is applied to drive those of the tuning fork arms 23 and 26. As an alternative, the direction of polarization of the respective piezoelectric thin films in the tuning fork arms 24 and 25 may be set opposite to that of the respective piezoelectric thin films in the tuning fork arms 23 and 26, and alternating electric fields in the same phase may be applied to all the tuning fork arms 23 to 26.

Also in the second embodiment, it is just required that, assuming the thickness of the Si layer 11 in each of the tuning fork arms 23 to 26 is denoted by T1 and the total thickness of the silicon oxide layers 12a and the silicon oxide layer 12b is denoted by T2, the thickness ratio T2/(T1+T2) is within the range expressed by the above-described formula (1). Under such a condition, the absolute value of the temperature coefficient of resonant frequency (TCF) can be kept within ±5 ppm/° C.

Furthermore, according to the second embodiment, since the silicon oxide layers 12a and 12b are provided at both the sides of the Si layer 11, warping of the Si layer 11 can be suppressed.

In addition, according to the second embodiment, since the number of the tuning fork arms vibrating in one phase is equal to the number of the tuning fork arms vibrating in the opposite phase, vibration characteristics can be improved from those in the first embodiment.

Stated in another way, since the two tuning fork arms 24 and 25 and the two tuning fork arms 23 and 26 are vibrated in opposite phases, symmetry in vibration mode can be improved. As a result, vibration characteristics can be improved.

Figure 8:
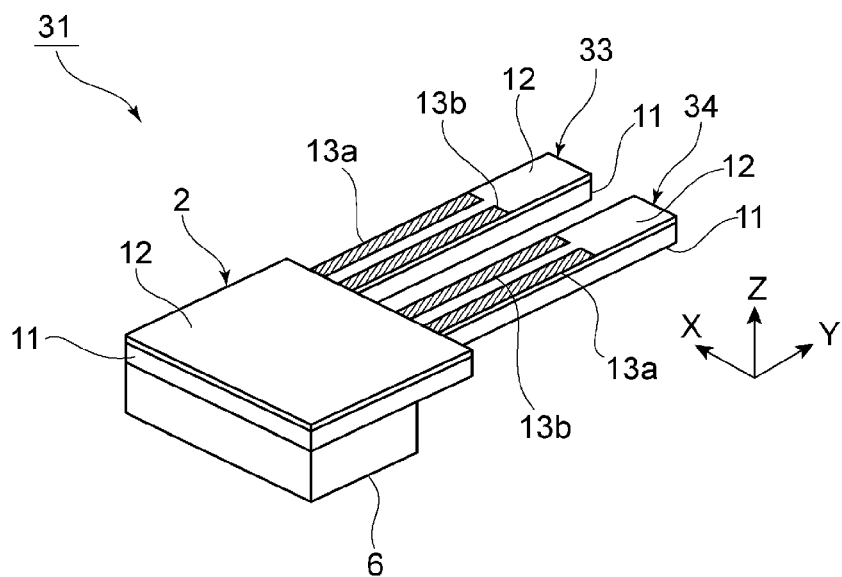
FIG. 8 is a perspective view of a vibrating device according to a third embodiment of the present invention.

FIG. 8 is a perspective view of a vibrating device according to a third embodiment of the present invention. The vibrating device 31 of the third embodiment includes the base portion 2 and the support portion 6 as in the first embodiment. In the base portion 2, the silicon oxide layer 12 is laminated on the Si layer 11. In this embodiment, two tuning fork arms 33 and 34 are joined to the base portion 2. The tuning fork arms 33 and 34 extend in the Y-direction, and they are arranged side by side in the X-direction. Also in each of the tuning fork arms 33 and 34, the silicon oxide layer 12 is laminated on the Si layer 11.

The second embodiment is similar to the first embodiment except that the two tuning fork arms 33 and 34 are provided, and that excitation portions 13a and 13b are provided in each of the tuning fork arms. Accordingly, the same parts are denoted by the same reference signs, and description of those parts is omitted.

In this embodiment, one pair of excitation portions 13a and 13b is provided on the upper surface of the silicon oxide layer 12. More specifically, taking the tuning fork arm 33 as an example, the excitation portion 13a is provided on the upper surface of the silicon oxide layer 12 along one lateral edge extending in the Y-direction, and the excitation portion 13b is provided thereon along the other lateral edge extending in the Y-direction. The excitation portions 13a and 13b are each provided in a strip-like region extending in the Y-direction, and they are spaced from each other in the X-direction. Each of the excitation portions 13a and 13b includes the piezoelectric thin film 14 and the first and second electrodes 15 and 16 as in the excitation portion 13 of the first embodiment.

In this embodiment, the excitation portions 13a and 13b are driven in opposite phases. As a result, the tuning fork arm 33 causes flexural vibration in a plane containing the X-direction and the Y-direction.

The above description is similarly applied to the tuning fork arm 34. However, the tuning fork arm 33 and the tuning fork arm 34 are driven in opposite phases. In the vibration mode, therefore, the tuning fork arms 33 and 34 cause flexural vibrations in the XY-plane in a way of repeating a state where respective tips of the tuning fork arms 33 and 34 are positioned close to each other, and a state where the respective tips of the tuning fork arms 33 and 34 are positioned away from each other.

As described above, the tuning fork arms 33 and 34 are required to be driven in opposite phases. Thus, when the directions of polarizations of the respective piezoelectric thin films 14 in the excitation portions 13a and 13b in each of the tuning fork arms 33 and 34 are all the same, the phase of the alternating electric field applied to the excitation portion 13a of the tuning fork arm 33 is set to be opposite to the phase of the alternating electric field applied to the excitation portion 13a of the tuning fork arm 34. Similarly, the phase of the alternating electric field applied to the excitation portion 13b of the tuning fork arm 33 is set to be opposite to the phase of the alternating electric field applied to the excitation portion 13b of the tuning fork arm 34.

Instead of the above, the directions of polarizations of the respective piezoelectric thin films in the excitation portions 13a and 13b may be set opposite to each other. In such a case, the phases of the alternating electric fields applied to the excitation portions 13a and 13b in one tuning fork arm 33 may be set to be the same. This is equally applied to the tuning fork arm 34.

In the present invention, as in this embodiment, the plural tuning fork arms 33 and 34 may be constituted to cause the flexural vibrations in the X-direction. Also in this embodiment, the directions of vibrations are symmetric between one side of the centerline passing the center in the X-direction and extending in the Y-direction and the other side of the centerline.

In the vibrating device 31 in which the plural tuning fork arms 33 and 34 are displaced with in-plane vibrations as described above, the thickness ratio T2/(T1+T2) may fall within a range of $(-0.0003x^2-0.0236x+0.0219)\pm0.05$. Under such a condition, the absolute value of the TCF can be kept within the range of ±5 ppm/° C. That point will be described below with reference to FIG. 9.

Figure 9:
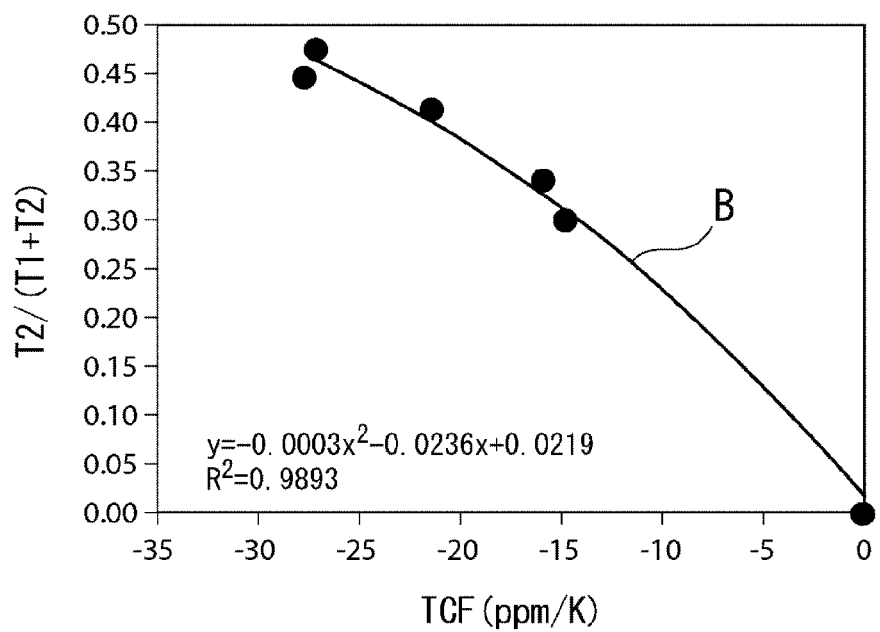
FIG. 9 is a graph depicting a relationship that the TCF becomes 0 in the third embodiment with lamination of a silicon oxide layer on an assumption that the TCF of doped Si without the provision of the silicon oxide layer is denoted by x and a thickness ratio T2/(T1+T2) is denoted by y.

The horizontal axis of FIG. 9 represents the TCF of a Si layer in which a certain amount of an n-type dopant is doped, and a value of the TCF is denoted by x. The vertical axis of FIG. 9 represents T2/(T1+T2) of which value is denoted by y. Points plotted in FIG. 9 represent positions at which the TCF becomes 0. A curve B is obtained with approximation on the basis of respective coordinates of the plotted points. The curve B is expressed by $y=-0.0003x^2-0.0236x+0.0219$. Thus, the thickness ratio T2/(T1+T2) is just selected to be positioned on the curve B depending on the value x of the TCF of the Si layer. As a result, the TCF in the vibrating device 31 can be made 0. Furthermore, the inventor of this application has confirmed that, when T2/(T1+T2) is within the range of $(-0.0003x^2-0.0236x+0.0219)\pm0.05$ . . . Formula (2), the TCF can be kept within a range of ±5 ppm/° C.

As described above, when the in-plane vibration is utilized, T2/(T1+T2) is required to fall within the range expressed by the above-mentioned formula (2).

The three or four tuning fork arms are arranged in the first and second embodiments, whereas the two tuning fork arms are joined to the base portion 2 in the third embodiment. In the present invention, the number of the tuning fork arms to be arranged plural is not limited to particular one.

Also in the third embodiment, the silicon oxide layers may be provided at both the surfaces of the Si layer. Moreover, a plurality of Si layers may be laminated in the third embodiment as well.

REFERENCE SIGNS LIST

1 . . . vibrating device
2 . . . base portion
3 to 5 . . . tuning fork arms
6 . . . support portion
11 . . . Si layer
12, 12a, 12b . . . silicon oxide layers
13, 13a, 13b, 17 . . . excitation portions
14 . . . piezoelectric thin film
14a . . . piezoelectric thin film layer
15, 16 . . . first and second electrodes
21 . . . vibrating device
23 to 26 . . . tuning fork arms
31 . . . vibrating device
33, 34 . . . tuning fork arms

The invention claimed is:

1. A vibrating device comprising:
a base portion; and
a plurality of tuning fork arms each being joined at one end thereof to the base portion and extending in a first direction, the plurality of tuning fork arms being arranged side by side in a second direction that is perpendicular to the first direction,
the plurality of tuning fork arms each configured to flexurally vibrate in a third direction that is perpendicular to the second direction and the first direction,
wherein each of the plurality of tuning fork arms include a Si layer made of a degenerate semiconductor, a silicon oxide layer, a piezoelectric layer, and first and second electrodes through which a voltage is applied to the piezoelectric layer, and wherein when a total thickness of the Si layer is denoted by T1, a total thickness of the silicon oxide layer is denoted by T2, and a temperature coefficient of resonant frequency in the vibrating device when the silicon oxide layer is not provided is denoted by x, T2/(T1+T2) is within a range of $(-0.0002x^2-0.0136x+0.0014)\pm0.05$.

2. The vibrating device according to claim 1, wherein directions of vibrations of the plurality of tuning fork arms are symmetric between a first side of a centerline passing a center in the second direction and extending in the first direction and a second side of the centerline opposite the first side.

3. The vibrating device according to claim 1, wherein the Si layer is doped with an n-type dopant.

4. The vibrating device according to claim 3, wherein the dopant is phosphorus.

5. The vibrating device according to claim 1, wherein the silicon oxide layer is on a first principal surface of the Si layer.

6. The vibrating device according to claim 1, wherein the first electrode is disposed on a first principal surface of the piezoelectric layer, and the second electrode is disposed on a second principal surface of the piezoelectric layer opposite the first principal surface.

7. The vibrating device according to claim 1, wherein the Si layer is also the second electrode.

8. The vibrating device according to claim 5, wherein the silicon oxide layer is a first silicon oxide layer and the vibrating device further comprises a second silicon oxide layer on a second principal surface of the Si layer opposite the first principal surface.

9. A vibrating device comprising:
a base portion; and
a plurality of tuning fork arms each being joined at one end thereof to the base portion and extending in a first direction, the plurality of tuning fork arms being arranged side by side in an second direction that is perpendicular to the first direction, the plurality of tuning fork arms each configured to flexurally vibrate in the second direction,
wherein each of the plurality of tuning fork arms include a Si layer made of a degenerate semiconductor, a silicon oxide layer, a piezoelectric layer, and first and second electrodes through which a voltage is applied to the piezoelectric layer, and wherein when a total thickness of the Si layer is denoted by T1, a total thickness of the silicon oxide layer is denoted by T2, and a temperature coefficient of resonant frequency in the vibrating device when the silicon oxide layer is not provided is denoted by x, T2/(T1+T2) is within a range of $(-0.0003x^2-0.0236x+0.0219)\pm0.05$.

10. The vibrating device according to claim 9, wherein directions of vibrations of the plurality of tuning fork arms are symmetric between a first side of a centerline passing a center in the second direction and extending in the first direction and a second side of the centerline opposite the first side.

11. The vibrating device according to claim 9, wherein the Si layer is doped with an n-type dopant.

12. The vibrating device according to claim 11, wherein the dopant is phosphorus.

13. The vibrating device according to claim 9, wherein the silicon oxide layer is on a first principal surface of the Si layer.

14. The vibrating device according to claim 9, wherein the first electrode is disposed on a first principal surface of the piezoelectric layer, and the second electrode is disposed on a second principal surface of the piezoelectric layer opposite the first principal surface.

15. The vibrating device according to claim 9, wherein the Si layer is also the second electrode.

16. The vibrating device according to claim 13, wherein the silicon oxide layer is a first silicon oxide layer and the vibrating device further comprises a second silicon oxide layer on a second principal surface of the Si layer opposite the first principal surface.

* * * * *